United States Patent
Lee et al.

(10) Patent No.: US 7,557,627 B2
(45) Date of Patent: Jul. 7, 2009

(54) SEMICONDUCTOR MEMORY DEVICE FOR GENERATING A DELAY LOCKED CLOCK IN EARLY STAGE

(75) Inventors: Hyun-Woo Lee, Kyoungki-do (KR);
Won-Joo Yun, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 144 days.

(21) Appl. No.: 11/715,783

(22) Filed: Mar. 8, 2007

(65) Prior Publication Data
US 2008/0062809 A1 Mar. 13, 2008

(30) Foreign Application Priority Data
Aug. 31, 2006 (KR) .................... 10-2006-0083738

(51) Int. Cl.
*H03L 7/06* (2006.01)
(52) U.S. Cl. ...................... 327/158; 327/161
(58) Field of Classification Search ............. 327/158, 327/161
See application file for complete search history.

(56) References Cited

U.S. PATENT DOCUMENTS

| | | | |
|---|---|---|---|
| 5,939,912 A * | 8/1999 | Rehm ......................... 327/158 |
| 6,282,210 B1 * | 8/2001 | Rapport et al. .............. 370/518 |
| 6,943,602 B1 | 9/2005 | Lee |
| 6,985,401 B2 | 1/2006 | Jang et al. |
| 6,987,408 B2 | 1/2006 | Kim |
| 6,995,591 B2 | 2/2006 | Lee |
| 7,088,155 B2 * | 8/2006 | Takahashi ................... 327/144 |
| 7,103,133 B2 | 9/2006 | Jung |
| 7,199,625 B1 * | 4/2007 | Chung ........................ 327/149 |
| 2005/0195663 A1 | 9/2005 | Kwak |

FOREIGN PATENT DOCUMENTS

| | | |
|---|---|---|
| JP | 2003-045183 | 2/2003 |
| JP | 2004-104747 | 4/2004 |
| JP | 2005-251368 | 9/2005 |
| JP | 2005-332548 | 12/2005 |
| KR | 10-2005-0049236 | 5/2005 |
| KR | 10-2006-0036662 | 5/2006 |

\* cited by examiner

*Primary Examiner*—Kenneth B. Wells
(74) *Attorney, Agent, or Firm*—Blakely, Sokoloff, Taylor & Zafman LLP

(57) ABSTRACT

A semiconductor memory apparatus includes a first delay locked loop configured to delay a system clock by a predetermined time to thereby generate a first delay locked clock synchronizing a data output timing with the system clock, a second delay locked loop configured to delay an inverse signal of the system clock by a predetermined time to thereby generate a second delay locked clock synchronizing the data output timing with the system clock, and a clock selection block configured to select one of the first and second delay locked clocks to thereby output as a reference clock for data output.

8 Claims, 5 Drawing Sheets

SEMICONDUCTOR MEMORY DEVICE FOR GENERATING A DELAY LOCKED CLOCK IN EARLY STAGE

CROSS-REFERENCE TO RELATED APPLICATIONS

The present invention claims priority of Korean patent application number 10-2006-0083738, filed on Aug. 31, 2006, which is incorporated by reference in its entirety.

BACKGROUND OF THE INVENTION

The present invention relates to a semiconductor device, and more particularly, to a semiconductor memory apparatus with a delay locked loop circuit.

A semiconductor memory apparatus embodied in a system which includes a plurality of semiconductor devices is used for storing data. The semiconductor memory apparatus outputs data stored in a cell corresponding to an address outputted from a data requesting unit such as a central processing unit or stores data provided from the data requesting unit into the cell.

As the operational speed of a system including a plurality of semiconductor devices has increased and the technology related to a semiconductor integrated circuit has advanced, there has been a demand for increasing data access speed of the semiconductor memory apparatus. In order to access data of semiconductor memory apparatus with a high speed, a synchronous memory apparatus which receives a system clock and can access data every time synchronized with transition of the received system clock has been proposed. Nevertheless, the synchronous memory apparatus cannot meet data access speed required by the system, particularly, the data requesting unit included in the system. Accordingly, a double data rate (DDR) synchronous semiconductor memory apparatus is proposed which can access data every rising edge and falling edge of the system clock.

The DDR synchronous semiconductor memory apparatus should receive or output two data within one cycle of the system clock, since the DDR synchronous semiconductor memory apparatus accesses one data every transition of the system clock. That is, the DDR synchronous semiconductor memory apparatus should output or receive data every time exactly synchronized with the rising edge and falling edge of the system clock. Typically, the output circuit of the DDR synchronous semiconductor memory apparatus receives the system clock through a clock transfer path including a clock buffer, clock transmission lines, and the like inside the DDR synchronous semiconductor memory apparatus and outputs data synchronized with the received system clock.

However, the system clock reaches the output circuit of the DDR synchronous semiconductor memory apparatus with an essential delay occurring while passing through the clock input buffer and the clock signal transmission lines arranged in the DDR synchronous semiconductor memory apparatus. Although the output circuit outputs data in synchronization with the reached system clock, data delayed by the essential delay are inputted to an external device receiving data from the DDR synchronous semiconductor memory apparatus.

To solve the above described problem, the DDR synchronous semiconductor memory apparatus includes a circuit, i.e., a delay locked loop circuit for adjusting the essential delay by locking a delay of the transferred system clock. The delay locked loop compensates for a delay value caused by the clock transfer path of the semiconductor memory apparatus. The delay locked loop circuit detects a delay value which occurs while an inputted system clock passes through the clock transfer path including the clock input circuit, the clock signal transmission lines, and the like and delays the inputted system clock for a delay time corresponding to the detected delay value to thereby output the delayed system clock into the output circuit. That is, the delay locked loop circuit intentionally delays and locks the inputted system clock by a constant delay value depending on an amount of the detected delay value to output the delay locked clock into the output circuit. Then, the output circuit outputs a data synchronized with the delay locked clock. The data outputted from the output circuit is exactly transferred to the external device, synchronized with the system clock.

Substantially, the delay locked clock is inputted to the output circuit at one previous cycle before the data is outputted; and, synchronized with the delay locked clock, the output circuit outputs the data. Namely, for synchronizing the outputted data with the system clock, the data should be outputted faster than the system clock is delayed on the clock transfer path. Outside the semiconductor memory apparatus, the outputted data are exactly synchronized with rising and falling edges of the system clock, input to the semiconductor memory apparatus. Consequently, the delay locked loop is a circuit for determining how much the data is outputted faster than the timing of data output in order to compensate the delay value of the system clock inside the semiconductor memory apparatus.

FIG. 1 illustrates a timing diagram describing an operation of a delay locked loop for use in a conventional semiconductor memory apparatus.

As shown, the delay locked loop generates a delay locked clock DLL_OUT of which phase leads that of inputted internal clock CLKI. Herein, the internal clock CLKI is generated based on an external clock CLK0 from a clock buffer or an internal clock generator. The semiconductor memory apparatus outputs data D0, D1, and D2, synchronized with the delay locked clock DLL_OUT. If the data D0, D1, and D2 are synchronized with the delay locked clock DLL_OUT, the data can be also synchronized with the external clock CLK0.

Generally, the delay locked loop includes a delay line for delaying an internal clock, a delay line controller for controlling a delay amount of the delay line, a delay model for delaying an output of the delay line by an estimated amount, i.e., how long time the internal clock is delayed by a clock path inside the semiconductor memory apparatus, and a phase comparator for comparing a phase of the internal clock with that of an output of the delay model. Accordingly, a delay amount range of the delay line, e.g., a minimum or maximum delay amount, is a critical factor for examining a capability of the delay locked loop.

For example, if a phase difference between two clocks compared by the phase comparator is larger than the maximum delay amount of the delay line, the delay locked loop cannot operate without any error or trouble. Since a size of the delay line is increased if a maximum delay amount of the delay line becomes larger, the maximum delay amount is fixed based on a circumstance such as a frequency of a system clock inputted to the semiconductor memory apparatus.

Even though the semiconductor memory apparatus is designed in order to guarantee that the delay line will have a sufficient maximum delay amount, another problem can occur. If the delay line delays a clock signal for the sufficient maximum delay amount, a locking time from a timing of inputting the clock signal to a timing of locking the clock signal to an output of the delay model increases. The locking time is larger, the power consumption become larger and a data access time increases.

Further, another problem of a general delay locked loop is a stuck phenomenon which occurs during a delay locked state, i.e., a locking state. The stuck phenomenon means that, when it is necessary to rearrange a locked delay amount because of a variation or fluctuation of power voltage level after the delay locked loop is locked, a rearranged delay amount is against the delay amount range of the delay line.

SUMMARY OF THE INVENTION

Embodiments of the present invention are directed to providing a semiconductor memory apparatus for generating a delay locked clock in early stage by reducing a locking time and preventing a delay locked loop from experiencing a stuck phenomenon.

In accordance with an aspect of the present invention, there is provided a semiconductor memory apparatus including a first delay locked loop configured to delay a system clock by a predetermined time to thereby generate a first delay locked clock synchronizing a data output timing with the system clock, a second delay locked loop configured to delay an inverse signal of the system clock by a predetermined time to thereby generate a second delay locked clock synchronizing the data output timing with the system clock, and a clock selection block configured to select one of the first and second delay locked clocks to thereby output as a reference clock for data output.

In accordance with another aspect of the present invention, there is provided a semiconductor memory apparatus including a first delay line configured to delay the system clock, a first delay model configured to delay an output of the first delay line by a modeled delay time to generate a first feedback clock, a first phase comparator configured to compare a phase of the first feedback clock with that of the system clock, a first shift register configured to control a delay amount of the first delay line according to a comparison result of the first phase comparator, a second delay line configured to delay the system clock, a second delay model configured to delay an output of the second delay line by the modeled delay time to generate a second feedback clock, a second phase comparator configured to compare a phase of the second feedback clock with that of the system clock, a second shift register configured to control a delay amount of the second delay line according to a comparison result of the second phase comparator, a first locked detector configured to output a first locking signal to the clock selection block when the phase of the first feedback clock is same to that of the system clock, a second locked detector configured to output a second locking signal to the clock selection block when the phase of the second feedback clock is same to that of the system clock, and a clock selection block configured to select one of the first and second delay locked clocks in response to the first and second locking clocks to thereby output as a reference clock for data output.

In accordance with another aspect of the present invention, there is provided a semiconductor memory apparatus including a first delay line configured to delay the system clock, a second delay line configured to delay the system clock, a delay model configured to delay outputs of the first and second delay lines by a modeled delay time respectively to generate first and second feedback clocks, a phase comparator configured to compare phases of the first and second feedback clocks with that of the system clock respectively, a delay line controller configured to control delay amounts of the first and second delay lines according to comparison results of the phase comparator, and a clock selection circuit configured to select one of the first and second delay locked clocks based on the comparison results to thereby output a reference clock for data output.

In accordance with still another aspect of the present invention, there is provided a method for generating a reference clock for data access, including delaying outputs of the first and second delay lines by a modeled delay time respectively to generate first and second feedback clocks, comparing phases of the first and second feedback clocks with that of the system clock respectively, determining delay amounts of the first and second delay lines according to comparison results of the phase comparator, in the first and second delay lines, respectively delaying input clocks by the delay amounts, and selecting one of the first and second delay locked clocks based on the comparison results to thereby output as a reference clock for data output.

DESCRIPTION OF SPECIFIC EMBODIMENTS

In accordance with an embodiment of the present invention, a semiconductor memory apparatus can generate a delay locked clock earlier than a delay locking time based on a maximum delay amount of delay line. Further, a delay locked loop in the semiconductor memory apparatus according to the present invention can eliminate a stuck phenomenon and guarantee a wide locking range of the delay line. Thus, the semiconductor memory apparatus can reduce a data access time and operate stably to thereby output data corresponding to input command and address in synchronization with a system clock.

Hereinafter, a semiconductor memory apparatus in accordance with specific embodiments of the present invention will be described in detail with reference to the accompanying drawings.

Figure 1:
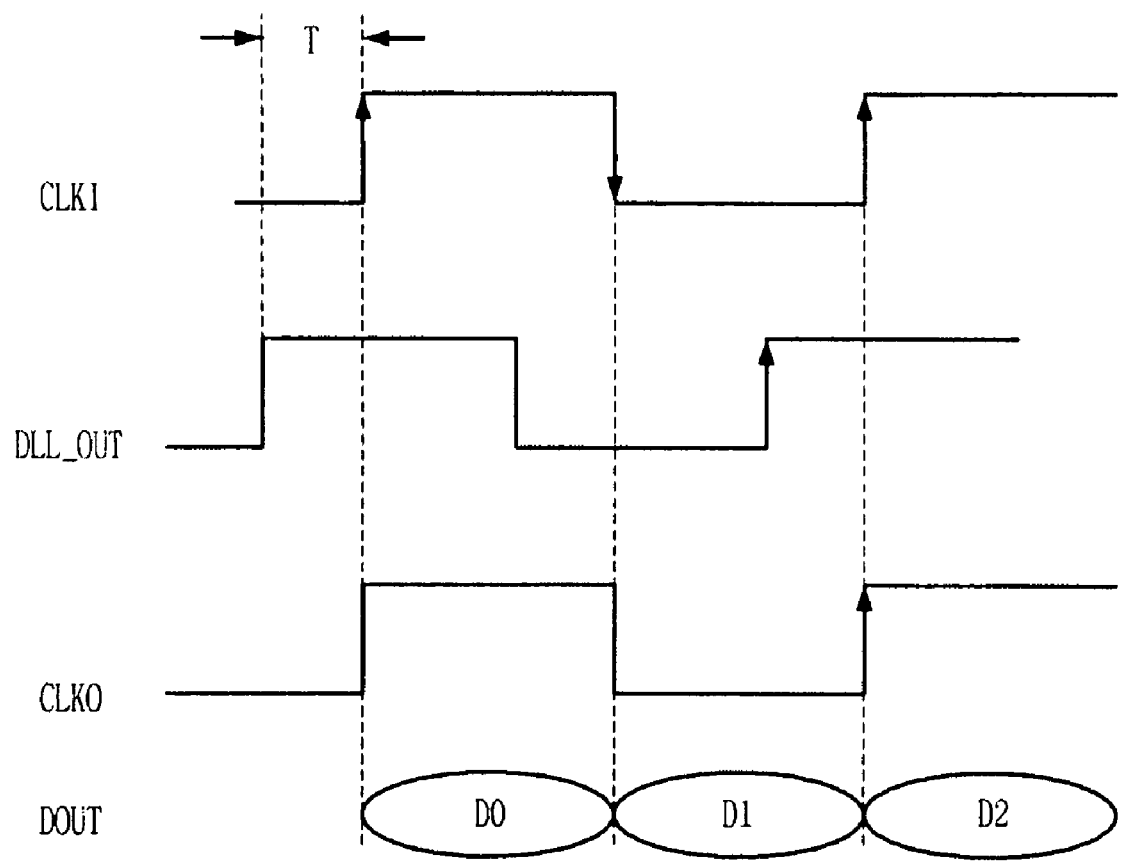
FIG. 1 illustrates a timing diagram describing an operation of a delay locked loop for use in a conventional semiconductor memory apparatus.
Figure 2:
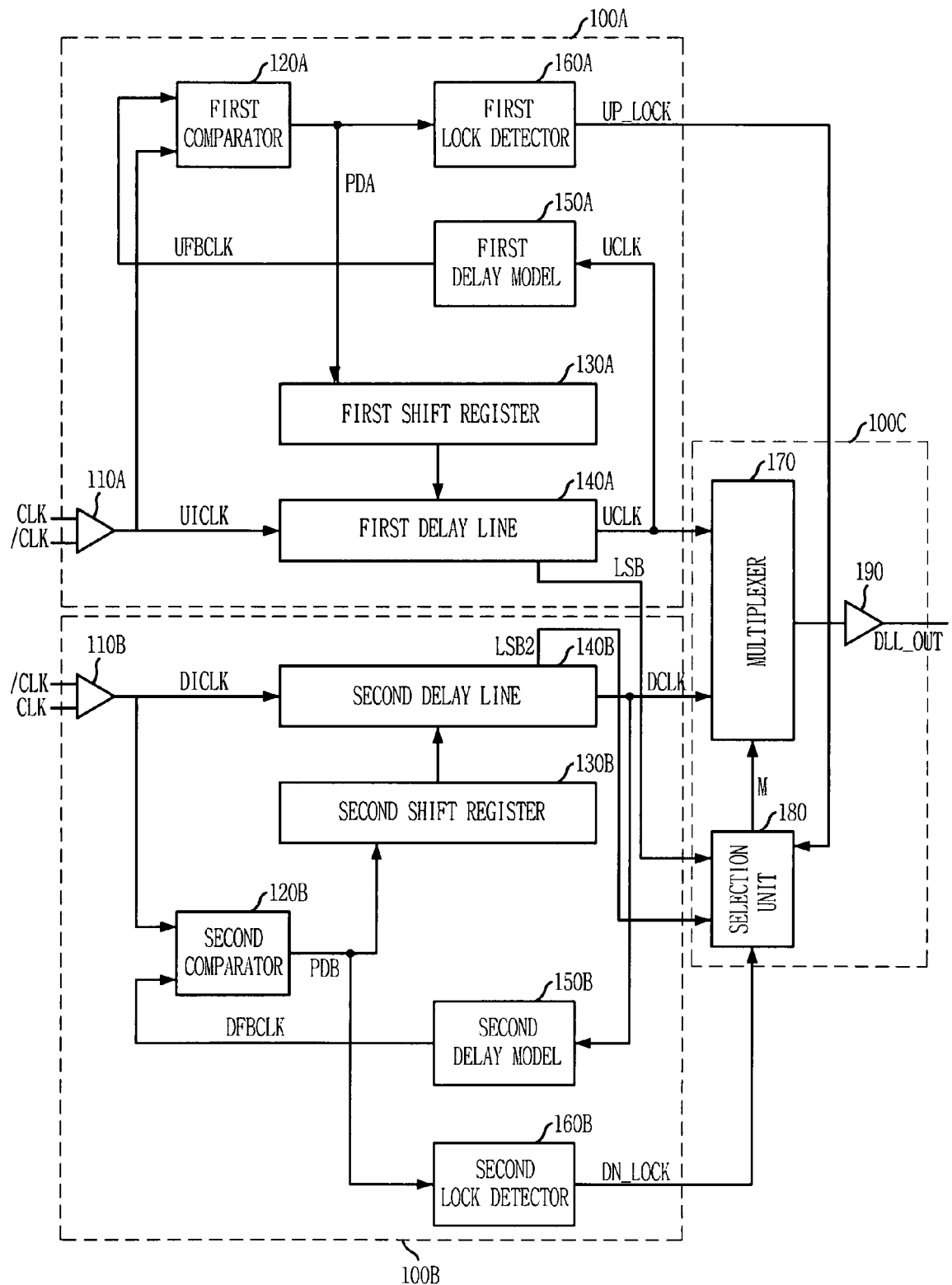
FIG. 2 illustrates a block diagram of a semiconductor memory apparatus according to an embodiment of the present invention.

FIG. 2 illustrates a block diagram of a semiconductor memory apparatus according to an embodiment of the present invention.

As shown, the semiconductor memory apparatus includes a first delay locked loop 100A, a second delay locked loop 100B, and a clock selection block 100C.

The first delay locked loop 100A compares a system clock CLK and /CLK with a first feedback clock UFBCLK which is delayed for a modeled delay time to thereby generate a first delay locked clock UCLK used for synchronizing a data output timing with the system clock.

The second delay locked loop 200A delays an inverse signal of the system clock CLK and /CLK by a predetermined time such as the modeled delay time to generate a second feedback clock DFBCLK, and compares the system clock with the second feedback clock DFBCLK to thereby generate a second delay locked clock DCLK used for synchronizing the data output timing with the system clock.

The clock selection block 100C selects one of the first and second delay locked clocks UCLK and DCLK to thereby output as a reference clock DLL_OUT for data output. Finally, if the semiconductor memory apparatus outputs a data in synchronization with the reference clock DLL_OUT, it is shown on an outside of the semiconductor memory apparatus that the outputted data is synchronized with the system clock.

The first delay locked loop 100A includes a first clock input buffer 110A, a first phase comparator 120A, a first shift register 130A, a first delay line 140A, a first delay model 150A, and a first lock detector 160A.

The first clock input buffer 110A buffers the system clock CLK and /CLK and transfers a first buffered clock UICLK to the first delay line 140A. The first phase comparator 120A compares a phase of the first feedback clock UFBCLK with that of the first buffered clock UICLK. The first shift register 130A controls a delay amount of the first delay line 140A according to a comparison result of the first phase comparator 120A. The first delay line 140A delays the first buffered clock UICLK by the delay amount controlled by the first shift register 130A. The first delay model 150A delays an output of the first delay line 140A by a modeled delay time to generate the first feedback clock UFBCLK. Herein, the modeled delay time is estimated based on how long time the internal clock is delayed by a clock path inside the semiconductor memory apparatus. The first locked detector 160A outputs a first locking signal UP_LOCK to the clock selection block 100C when the phase of the first feedback clock UFBCLK is the same as that of the first buffered clock UICLK.

The second delay locked loop 100B includes a second clock input buffer 110B, a second phase comparator 120B, a second shift register 130B, a second delay line 140B, a second delay model 150B, and a second lock detector 160B.

The second clock input buffer 110B buffers the system clock CLK and /CLK and transfers a second buffered clock DICLK to the second delay line 140B. The second phase comparator 120B compares a phase of the second feedback clock DFBCLK with that of the second buffered clock DICLK. The second shift register 130B controls a delay amount of the second delay line 140B according to a comparison result of the second phase comparator 120B. The second delay line 140B delays the second buffered clock DICLK by the delay amount controlled by the second shift register 130B. The second delay model 150B delays an output of the second delay line 140B by the modeled delay time to generate the second feedback clock DFBCLK. The second locked detector 160B outputs a second locking signal DP_LOCK to the clock selection block 100C when the phase of the second feedback clock DFBCLK is same to that of the second buffered clock DICLK.

The clock selection block 100C includes a multiplexer 170 and a selection unit 180. The multiplexer 170 outputs one of the first and second delay locked clocks UCLK and DCLK as the reference clock DLL_OUT. The selection unit 180 controls a selection of the multiplexer in response to the first and second locking signals UP_LOCK and DN_LOCK. Further, the clock selection block 180 can include an output buffer 190 for buffering an output of the multiplexer 170.

Figure 3:
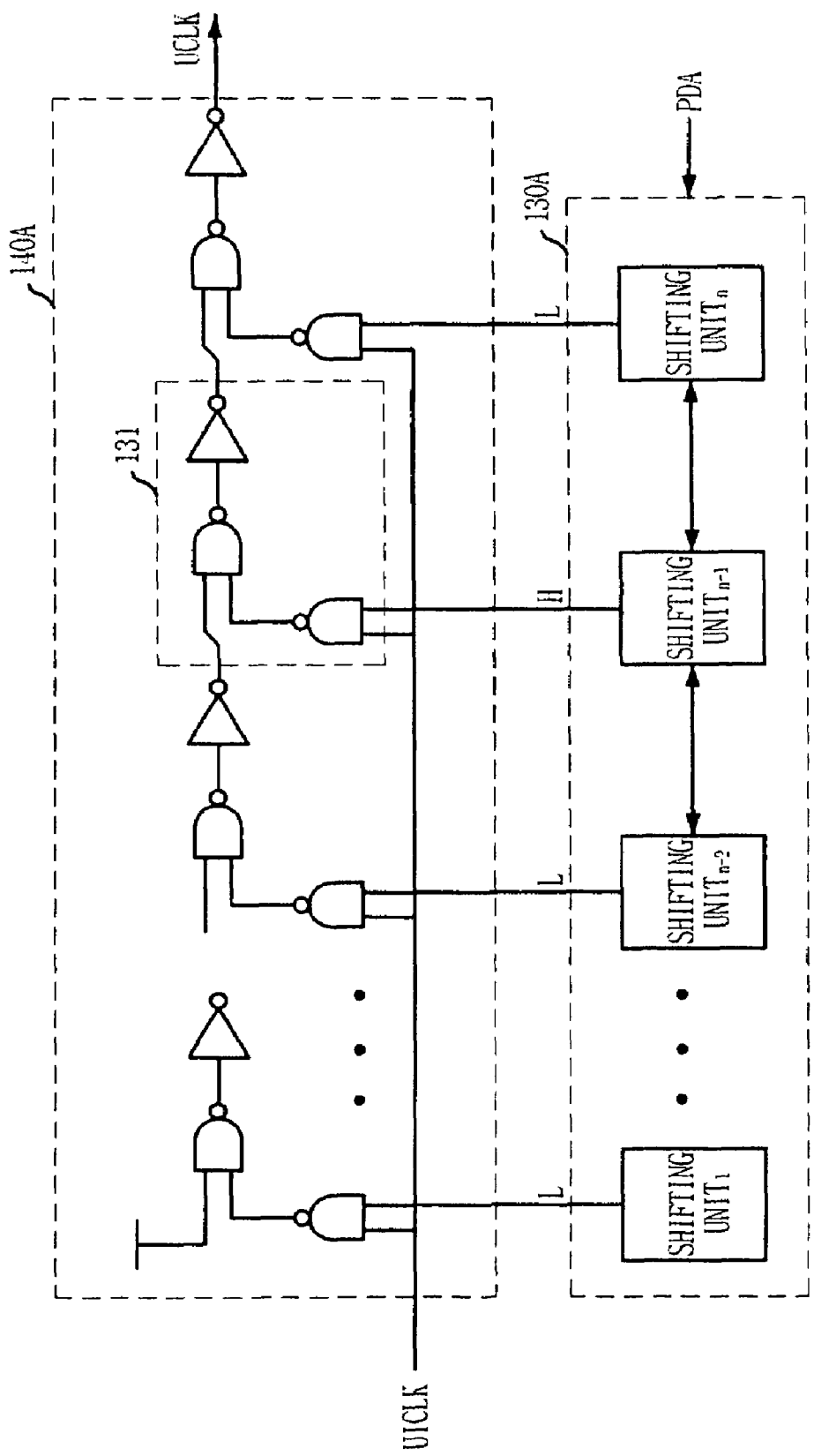
FIG. 3 illustrates a block diagram of an embodiment of a first delay line and a first shift register shown in FIG. 2.

FIG. 3 illustrates a block diagram of an embodiment of the first delay line 140A and the first shift register 130A shown in FIG. 2.

As shown, the first delay line 140A is constituted with a plurality of delay units 13 is, each coupled like a chain. The first shift register 130A including a plurality of shifting units shifts a position of generating a delay control signal having a logic high level according to a control signal PDA. In detail, how many delay units the buffered clock UICLK outputted from the first clock input buffer 110A is transmitted through is determined in response to a position of the logic high level delay control signal among a plurality of delay control signals outputted from the first shift register 130A to the first delay line 140A. Herein, the control signal PDA is outputted from the first phase comparator 120A.

Figure 4:
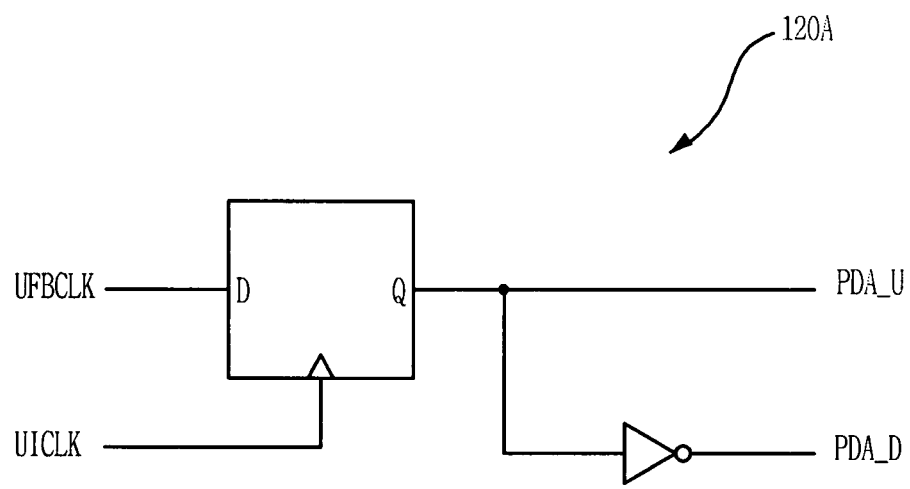
FIG. 4 illustrates schematic circuit diagram and waveform of an embodiment of a first phase comparator shown in FIG. 2.

FIG. 4 illustrates a schematic circuit diagram and waveform of an embodiment of a first phase comparator 120A shown in FIG. 2.

As shown, the first phase comparator 120A receives two input clocks, i.e., the buffered clock UICLK and the first feedback clock UFBCLK, and compares the two input clocks to thereby generate the control signal PDA. The first phase comparator 120A for comparing two input clocks can be designed variously. Herein, the first phase comparator 120A shown in FIG. 4 is implemented by a D flip-flop as one of the simplest structures. Referring to FIG. 4, the control signal PDA can be constituted with two complementary control signals PDA_U and PDA_D which can indicate which one of two buffered clocks, e.g., UICLK and UFBCLK, is advanced.

Figure 5:
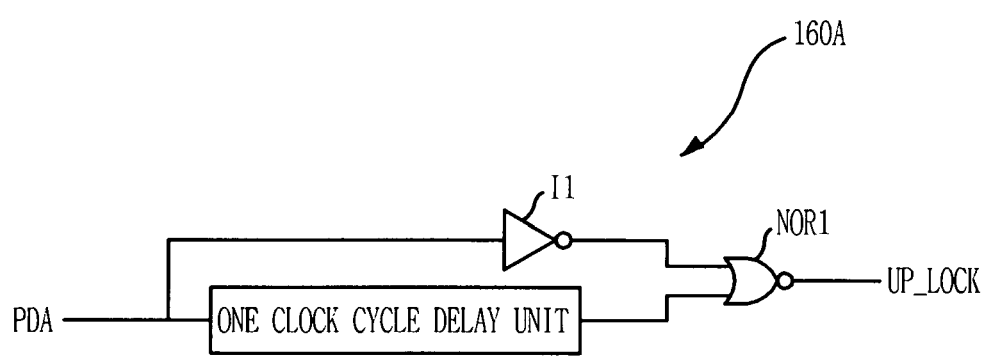
FIG. 5 illustrates a schematic circuit diagram of an embodiment of a first lock detector shown in FIG. 2.

FIG. 5 illustrates a schematic circuit diagram of an embodiment of the first lock detector 160A shown in FIG. 2.

As shown, the first lock detector 160A receives the control signal PDA to generate the first locking signal UP_LOCK. Herein, the first lock detector 160A can detect a rising edge of the control signal PDA, i.e., a timing of transiting a level of the control signal PDA from a logic low level to a logic high level. However, according to an embodiment of the present invention, the first lock detector 160 can be designed as a detector configured to detect a falling edge of the control signal PDA.

Figure 6:
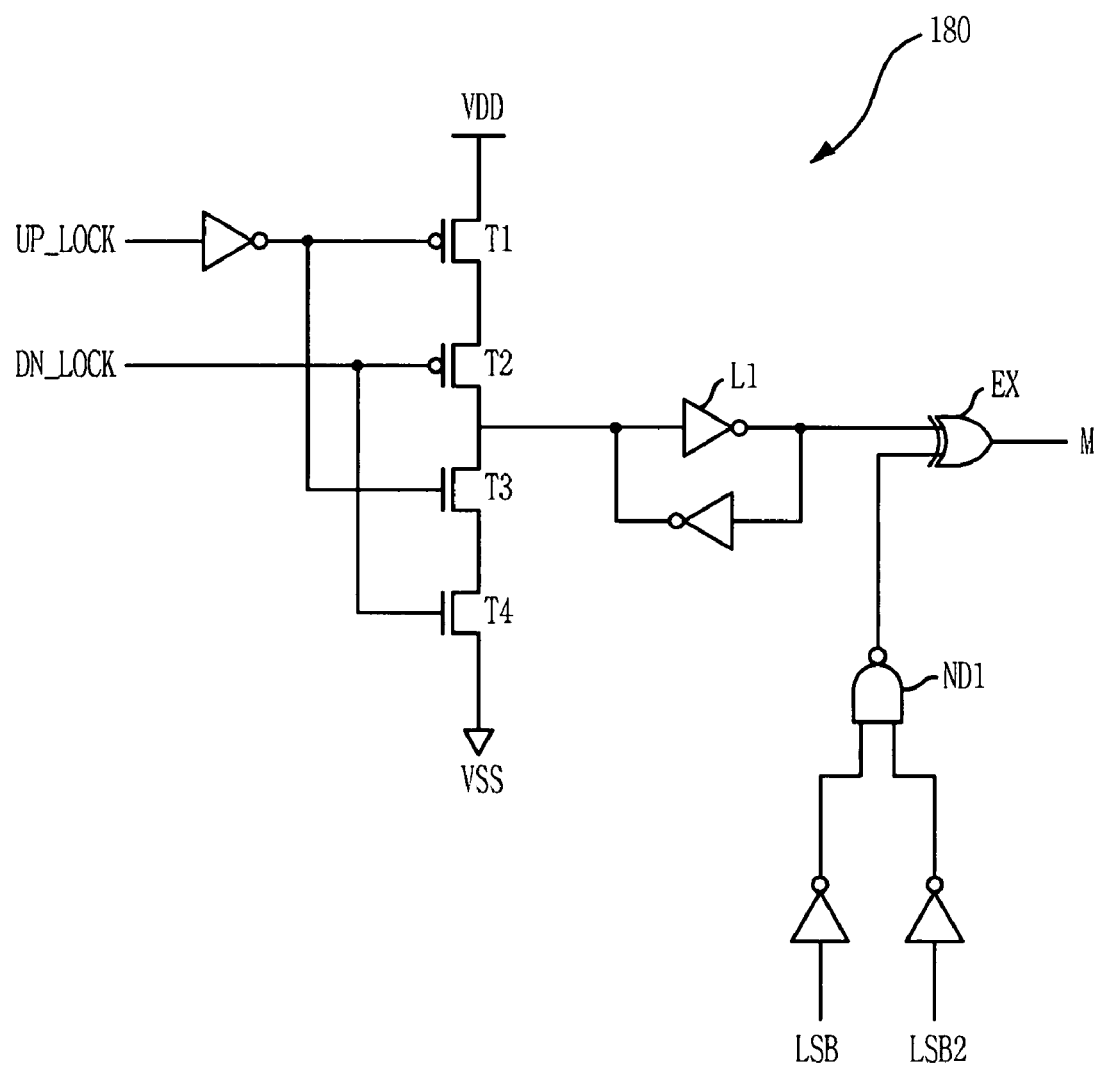
FIG. 6 illustrates a schematic circuit diagram of an embodiment of a clock selection block shown in FIG. 2.

FIG. 6 illustrates a schematic circuit diagram of an embodiment of the clock selection block 180 shown in FIG. 2.

As shown, the clock selection block 180 outputs a select signal M having logic high or low level into the multiplexer 170. The multiplexer 170 selects one of the outputs of the first and second delay lines 130A and 130B in response to the select signal M.

Hereinafter, referring to FIGS. 1 to 6, an operation of the semiconductor memory apparatus in accordance with the present invention is described in detail.

For generating a delay locked clock in a semiconductor memory apparatus, a delay locked loop circuit uses two delay lines. The two delay lines may reduce a stuck phenomenon and a locking time. However, the semiconductor memory apparatus according to the present invention includes not only two delay lines but also two phase comparators, two shift registers, two lock detectors, etc. Herein, according to another embodiment of the present invention, if one of the two delay lines operates with a reference to a rising system clock, the other of the two delay lines operates with a reference to a falling system clock.

Further, according to an embodiment of the present invention, the first delay line 140A delays the buffered clock UICLK and the first delay locked loop 100A performs a delay locking operation by comparing the buffered clock UICLK with the first feedback clock UFBCLK outputted through the first delay model 150A. Otherwise, the second delay line 140B delays an inverse signal DICLK of the input clock and the second delay locked loop 100B performs another delay locking operation by comparing the inverse signal DICLK with the second feedback clock DFBCLK outputted through the second delay model 150B. The first and second delay loops 100A and 100B perform independent delay locking operations respectively and, thus, the delay locked loop circuit can achieve a locking state from one of the first and second delay locked loops within a half period of system clock.

The semiconductor memory apparatus selects the one of the two outputs from the first and second delay locked loops which is delay-locked faster than the other of the two outputs to use as the delay locked signal, i.e., a reference clock for data output. However, although the delayed locked signal is already generated, the stuck phenomenon can occur when a power voltage fluctuates and the delay locking operation is required.

For example, it is assumed that the first delay locked loop achieves the locking state faster and an output of the first delay locked loop is used as the reference clock. The locking state is released because the power voltage becomes unstable. And it is required that a delay amount of the first delay line should be reduced. However, if the delay amount of the first delay line is the minimum value, the released locking state can be recovered. Likewise, if a delay amount of the first delay line is the maximum value and a delay amount of first delay line should be increased, a released locking state can be also recovered. In these cases, the semiconductor memory apparatus according to the present invention uses the second delay locked loop to achieve new locking state again. This can be available because the second delay line of the second delay locked loop has different delay value from the first delay line. If the first delay line has the maximum delay value, the second delay line has fewer delay value than the first delay line; otherwise, if the first delay line has the minimum delay value, the second delay line has larger delay value.

Moreover, as above described, two delay locked loops in the semiconductor memory apparatus perform independent delay locking operations respectively. Then, the clock selection block selects one of two outputs from the first and second delay locked loops, which is delay-locked faster than the other of the two outputs. Two delay locked loops can perform delay locking operations, one below 0.5T and the other beyond 0.5T. That is, one delay locked loop achieves a locking state by using an input clock and the other delay locked loop performs a delay locking operation to an inverse signal of the input clock.

A system clock constituted with one CLK having an original phase and the other /CLK having an opposite phase is inputted to the delay locked loop circuit according to the present invention. One of two delay locked loops included in the delay locked loop circuit uses a rising edge of the original phase clock CLK for a delay locking operation, and the other uses that of the opposite phase clock /CLK.

Since the two delay locked loops perform independent delay locking operations respectively and faster delay locked signal is outputted as the reference clock, a locking time can be always maintained below 0.5 tCK (a half period of system clock). After one of two delay locked loops is delay-Locked within 0.5 tCK, the other continuously performs a delay locking operation to become delay-Locked.

While the semiconductor memory apparatus performs normal operations, one of the first and second delay locked clocks is used as the reference clock. Thereafter, the two delay locked loops 100A and 100B achieve a locking state respectively. However, when the power voltage fluctuates, if one of the first and second delay lines 140A and 140B cannot reduce its delay amount even though it is required that a delay amount of the first or second delay line 140A or 140B should be reduced, one of line section signals LSB and LSB2, each outputted from the first and second delay lines 140A and 140B is activated. Responsive to an activated signal among the line section signals LSB and LSB2, the clock selection block 100C selects the other of the first and second delay locked clocks, i.e., changes a clock selection from the first delay locked clock to the second delay locked clock or from the second delay locked clock to the first delay locked clock.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory apparatus, comprising:
    a first delay locked loop configured to compare a system clock with a delayed signal of the system clock to thereby generate a first delay locked clock synchronizing a data output timing with the system clock;
    a second delay locked loop configured to compare the system clock with a delayed and inversed signal of the system clock to thereby generate a second delay locked clock synchronizing the data output timing with the system clock; and
    a clock selection block configured to select one of the first and second delay locked clocks to thereby output a reference clock for data output,
    wherein the first delay locked loop includes:
        a first delay line configured to delay the system clock;
        a first delay model configured to delay an output of the first delay line by a modeled delay time to generate a first feedback clock;
        a first phase comparator configured to compare a phase of the first feedback clock with that of the system clock;
        a first shift register configured to control a delay amount of the first delay line according to a comparison result of the first phase comparator; and
        a first locked detector configured to output a first locking signal to the clock selection block when the phase of the first feedback clock is the same as that of the system clock.

2. The semiconductor memory apparatus of claim 1, wherein the first delay locked loop further includes a first clock input buffer configured to buffer the system clock to output the system clock into the first delay line.

3. The semiconductor memory apparatus of claim 2, wherein the second delay Locked loop includes:
    a second delay line configured to delay the system clock;
    a second delay model configured to delay an output of the second delay line by the modeled delay time to generate a second feedback clock;
    a second phase comparator configured to compare a phase of the second feedback clock with that of the system clock; and
    a second shift register configured to control a delay amount of the second delay line according to a comparison result of the second phase comparator.

4. The semiconductor memory apparatus of claim 3, wherein the second delay Locked loop further includes a second locked detector configured to output a second locking signal to the clock selection block when the phase of the second feedback clock is the same as that of the system clock.

5. The semiconductor memory apparatus of claim 4, wherein the second delay locked loop further includes a second clock input buffer configured to buffer the system clock to output the system clock into the second delay line.

6. The semiconductor memory apparatus of claim 5, wherein the clock selection block includes:

a multiplexer configured to output one of the first and second delay locked clocks as the reference clock; and a selection unit configured to control operation of the multiplexer in response to the first and second locking signals.

7. A semiconductor memory apparatus, comprising:

a first delay line configured to delay a system clock;

a first delay model configured to delay an output of the first delay line by a modeled delay time to generate a first feedback clock;

a first phase comparator configured to compare a phase of the first feedback clock with that of the system clock;

a first shift register configured to control a delay amount of the first delay line according to a comparison result of the first phase comparator;

a second delay line configured to delay the system clock;

a second delay model configured to delay an output of the second delay line by the modeled delay time to generate a second feedback clock;

a second phase comparator configured to compare a phase of the second feedback clock with that of the system clock;

a second shift register configured to control a delay amount of the second delay line according to a comparison result of the second phase comparator;

a first locked detector configured to output a first locking signal to the clock selection block when the phase of the first feedback clock is the same as that of the system clock;

a second locked detector configured to output a second locking signal to the clock selection block when the phase of the second feedback clock is the same as that of the system clock; and a clock selection block configured to select one of the first and second delay locked clocks in response to the first and second locking clocks to thereby output a reference clock for data output.

8. A semiconductor memory apparatus, comprising:

a first delay line configured to delay a system clock;

a second delay line configured to delay the system clock;

a first delay model configured to delay an output of the first delay line by a modeled delay time to generate a first feedback clock;

a second delay model configured to delay an output of the second delay line by the modeled delay time to generate a second feedback clock;

a first phase comparator configured to compare a phase of the first feedback clock with that of the system clock;

a second phase comparator configured to compare a phase of the second feedback clock with that of the system clock;

a first delay line controller configured to control a delay amount of the first delay line according to a comparison result of the first phase comparator;

a second delay line controller configured to control a delay amount of the second delay line according to a comparison result of the second phase comparator; and a clock selection circuit configured to select one of the first and second delay locked clocks based on the comparison results to thereby output a reference clock for data outputs wherein the clock selection circuit includes;

a first locked detector configured to output a first locking signal to a clock selection block when the phase of the first feedback clock is the same as that of the system clock;

a second locked detector configured to output a second locking signal to the clock selection block when the phase of the second feedback clock is the same as that of the system clock;

a multiplexer configured to output one of the first and second delay locked clocks as the reference clock; and a selection unit configured to control operation of the multiplexer in response to the first and second locking signals.

* * * * *